United States Patent
Lee et al.

(10) Patent No.: US 7,102,876 B2
(45) Date of Patent: Sep. 5, 2006

(54) STRUCTURE OF AN INTERLEAVING STRIPED CAPACITOR SUBSTRATE

(75) Inventors: Min-Lin Lee, Hsinchu (TW); Chin-Sun Shyu, Hsinchu (TW); Shur-Fen Liu, Hsinchu (TW); Jing-Pin Pan, Hsinchu (TW); Jinn-Shing King, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/039,924

(22) Filed: Jan. 24, 2005

(65) Prior Publication Data

US 2005/0146840 A1 Jul. 7, 2005

Related U.S. Application Data

(63) Continuation-in-part of application No. 10/378,603, filed on Mar. 5, 2003, now abandoned.

(51) Int. Cl.
*H01G 4/20* (2006.01)
(52) U.S. Cl. ...................................... 361/312; 361/793
(58) Field of Classification Search ........ 361/311–313, 361/301.4, 306.2, 792–795; 174/255, 260, 174/258; 428/209–210, 212, 901
See application file for complete search history.

(56) References Cited

U.S. PATENT DOCUMENTS

| 4,759,965 A | | 7/1988 | Kato et al. |
| 5,034,260 A | | 7/1991 | Kumagai et al. |
| 5,161,086 A | | 11/1992 | Howard et al. |
| 5,604,017 A | | 2/1997 | Frankosky |
| 5,708,570 A | * | 1/1998 | Polinski, Sr. ............... 361/762 |
| 5,799,379 A | * | 9/1998 | Galvagni et al. .......... 29/25.42 |
| 5,928,839 A | | 7/1999 | Rath et al. |

FOREIGN PATENT DOCUMENTS

JP 2-276287 A 11/1990

* cited by examiner

*Primary Examiner*—Eric W. Thomas
(74) *Attorney, Agent, or Firm*—Birch, Stewart, Kolasch & Birch, LLP (57) ABSTRACT

An interleaving striped capacitor substrate structure for pressing-type print circuit boards is disclosed. To meet the high-frequency, high-speed, and high-density requirements in modern electronic systems, the interleaving striped capacitor substrate structure uses several dielectric materials of different dielectric coefficients to make a dielectric layer. One dielectric layer can be stacked on another to form a multi-layered capacitor substrate so that a single capacitor substrate can provide the highest capacitance required for the decoupling capacitor to suppress high-frequency noise signals, and the lower dielectric coefficient substrate required for high-speed signal transmission. This simultaneously achieves the effects of reducing high-frequency transmission time and suppressing high-frequency noise.

18 Claims, 7 Drawing Sheets

STRUCTURE OF AN INTERLEAVING STRIPED CAPACITOR SUBSTRATE

This application is a Continuation-In-Part of application Ser. No. 10/378,603 filed on Mar. 5, 2003, now abandoned, the entire contents of which are hereby incorporated by reference and for which priority is claimed under 35 U.S.C. § 120.

BACKGROUND OF THE INVENTION

1. Field of Invention

The invention relates to a capacitor substrate and, in particular, to the structure of an interleaving striped capacitor substrate.

2. Related Art

The print circuit board for supporting electronic elements in normal electronic systems is usually a planar substrate of a single low dielectric coefficient material (such as glass fiber cloths). Its drawbacks are that the low dielectric coefficient material is not good at suppressing high-frequency noise and the integrity of passive elements on the print circuit board is poor. It is not ideal for modern electronic systems where high frequency, high speed and compactness are the basic requirements. Consequently, the print circuit board needs to be improved to suppress high-frequency noise, to enhance the integration of elements, and to reduce high-speed signal delays.

U.S. Pat. No. 5,161,086 provides an improved print circuit board to suppress high-frequency noise interference. In that patent, a conductive metal layer is attached to the upper and lower surfaces of a dielectric material layer to form a capacitor substrate. The capacitor substrate is stacked onto a print circuit board by pressing. Since each capacitor substrate has only one dielectric coefficient, if different capacitances are required (e.g., when one needs a low dielectric coefficient capacitor substrate for high-speed signal transmissions and a high dielectric coefficient capacitor substrate for the decoupling capacitor that suppresses high-frequency noise) one has to stack several capacitor substrates with different dielectric coefficients on the print circuit board.

The drawback of this method is that a single-layered capacitor substrate has only one dielectric coefficient that cannot simultaneously provide the capacitance properties required by a high-frequency and high-speed electronic system. In order to satisfy different electronic requirements, the cost of the print circuit board inevitably increases due to stacking multiple layers of capacitor substrates. For the mixed high-frequency analog and high-speed digital systems, the integrity of the added passive elements is still inadequate.

In addition, U.S. Pat. No. 4,759,965 provides a ceramic comprising two or more dielectric portions with different dielectric constants. However, according to the ceramic material used, it is difficult to manufacture a multi layered capacitor substrate and apply it to a large size substrate, so the highest capacitance that can be obtained is limited and the applications are restricted.

Furthermore, due to the ceramic material used, a high temperature sintering process is necessary for preparing a capacitor substrate. Therefore the cost is high.

SUMMARY OF THE INVENTION

To improve the prior art and to satisfy the requirements of a high-frequency, high-speed and high-density electronic system, the invention provides a single-layered or multi-layered capacitor substrate imbedded with interleaving striped capacitors. The disclosed single-layered interleaving striped capacitor substrate uses several lines of dielectric materials with different dielectric coefficients (the relative dielectric coefficient $\in_r$) on one plane. A single piece of the capacitor substrate thus made can simultaneously provide the low dielectric coefficient ($\in_r \leq 4$) required for high-speed signal transmissions and the high dielectric coefficient ($\in_r \geq 10$) required by the decoupling capacitor that suppresses high-frequency noise. This helps increase the integrity of elements and the circuit density.

Furthermore, because the invention uses organic-ceramic hybrid materials as dielectric materials for the interleaving striped capacitor substrate, more than one layer of the disclosed striped capacitor substrate can be easily stacked on a multilayer print circuit board. And a multilayer striped capacitor substrate has the advantage of providing a 3D connection of high K stripes and a 3D connection of low K stripes such that the substrate's capacitance can further increase according to requirements.

According to practical needs, the multilayer striped capacitor substrate can be stacked on a multi-layered or single-layered print circuit board for wider applications.

Accordingly, the multilayer striped capacitor substrate (6~20 layers) can provide very high capacitances (>100000 pf) to satisfy the needs of a high-speed digital system and motherboard to suppress high frequency noise.

The first structure of the invention includes: an organic dielectric layer formed using several lines of organic dielectric materials and a conductive metal layer on the top and bottom surfaces of the dielectric layer. By forming the required conductive wire pattern on the top and bottom conductive metal layer, the capacitor substrate with different dielectric coefficients can be designed as a capacitor or a signal transmission line.

The second structure of the invention includes: a first dielectric layer, which consists of a plurality of first interleaving striped dielectric materials; a second dielectric layer, which consists of a plurality of second interleaving striped dielectric materials and stacks on the first dielectric layer, wherein the direction of the second interleaving striped dielectric material is perpendicular to the first interleaving striped dielectric material; an upper conductive metal layer, which is attached to the upper surface of the second dielectric layer; and a lower conductive metal layer, which is attached to the bottom surface of the first dielectric layer.

For different circuit designs, the invention has another structure which includes: an organic dielectric layer comprised of several lines of organic dielectric materials and a conductive metal layer formed on the top surface of the organic dielectric layer. That is, the organic dielectric layer is only a capacitor substrate with a conductive metal layer on one surface. It can combine with the conductive layer on the print circuit board to form the desired capacitor.

To summarize, the disclosed interleaving striped capacitor substrate can be either single-layered or multi-layered and attached with either a layer of conductive metal on one surface of the organic dielectric layer, or a layer of conductive metal on both surfaces of the organic dielectric layer. Several such single-layered or multi-layered capacitor substrates may be used simultaneously in any layer of a multi-layered print circuit board, forming a multi-layered capacitor substrate.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The disclosed structure of an interleaving striped capacitor substrate utilizes several lines of dielectric materials of different dielectric coefficients (the relative dielectric coefficient $\in_r$) to make a striped capacitor substrate. Therefore, the single-layered capacitor substrate can simultaneously provide the low dielectric coefficient required for high-speed signal transmissions and the high dielectric coefficient required for the decoupling capacitor that suppresses high-frequency noise. Not only can the invention increase the transmission rate and suppress interference of high-frequency noise in an integrated electronic system, it can further reduce the number of layers on a substrate.

For different application ranges and for the capacitor substrate to be combined onto various circuit designs of print circuits, the invention provides two types of capacitor substrate structures. One contains a dielectric layer comprised of several lines of interleaving striped dielectric materials. Each of the upper and lower surfaces of the dielectric layer is attached with a conductive metal layer to form a three-layered capacitor substrate. The upper- and lower-surface metal layers are etched to produce capacitors. The capacitance is controlled by adjusting the area of the upper and lower surface metal layers.

The other structure contains multiple dielectric layers stacked together. Each dielectric layer is comprised of several lines of interleaving striped dielectric materials. A conductive metal layer is attached to the upper and lower surfaces of the outer dielectric layer to form a multi-layered capacitor substrate.

Furthermore, the single- or multi-layered dielectric layer comprised of several lines of interleaving striped dielectric material can only be provided with a first conductive metal layer to form a two-layered or multi-layered capacitor substrate. This structure is used to combine with a single-layered or multi-layered circuit board to form a multi-layered capacitor substrate embedded with interleaving striped capacitors. The surface of the print circuit board has a second conductive metal layer. The first conductive metal layer and the second conductive metal layer are etched to form several capacitors with the dielectric materials. The capacitance of each of the capacitors is controlled by adjusting the area of the first and second conductive metal layers.

Figure 1:
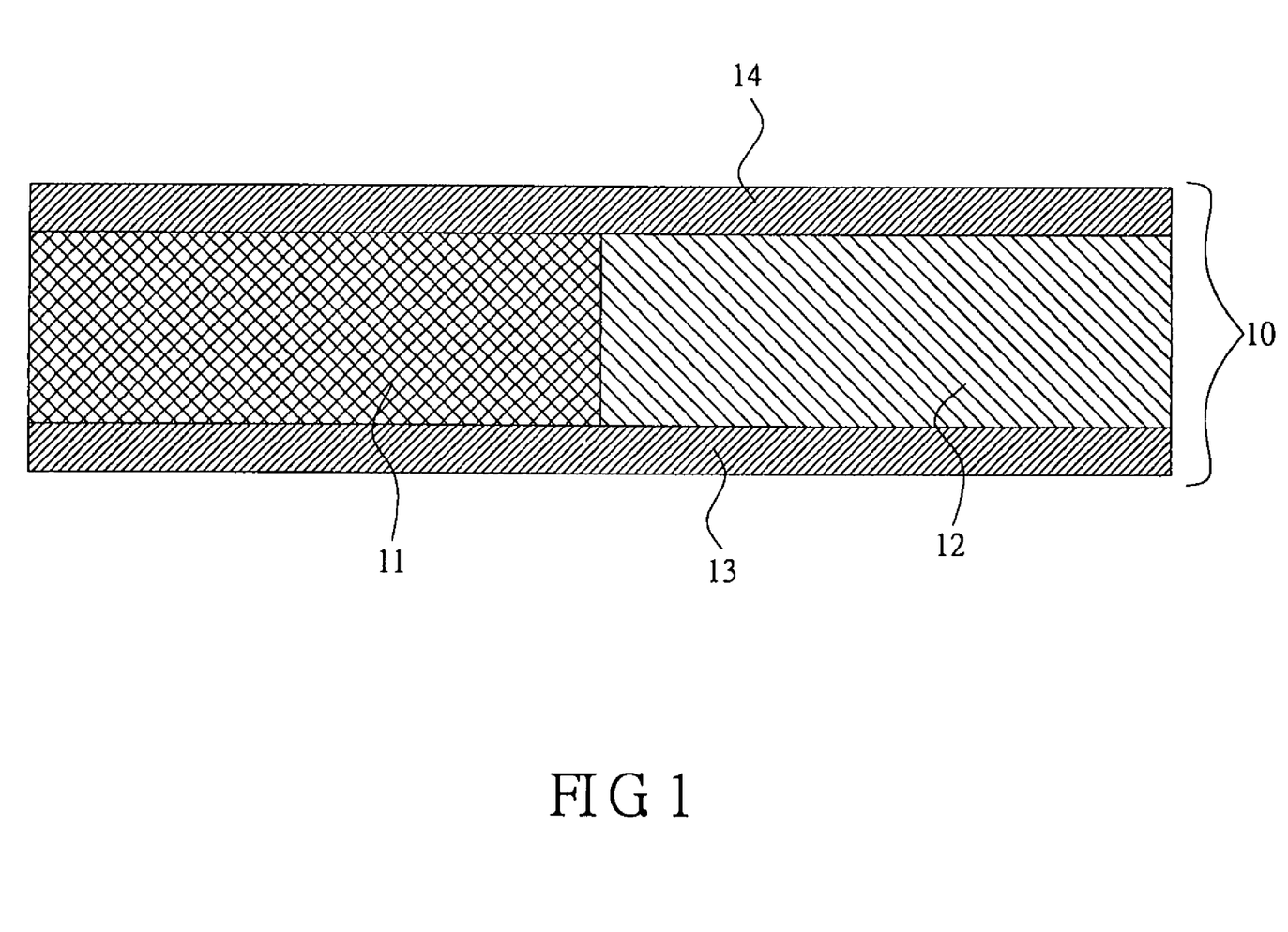
FIG. 1 is a schematic cross section of a triple-layered interleaving striped capacitor substrate of the invention.
Figure 2:
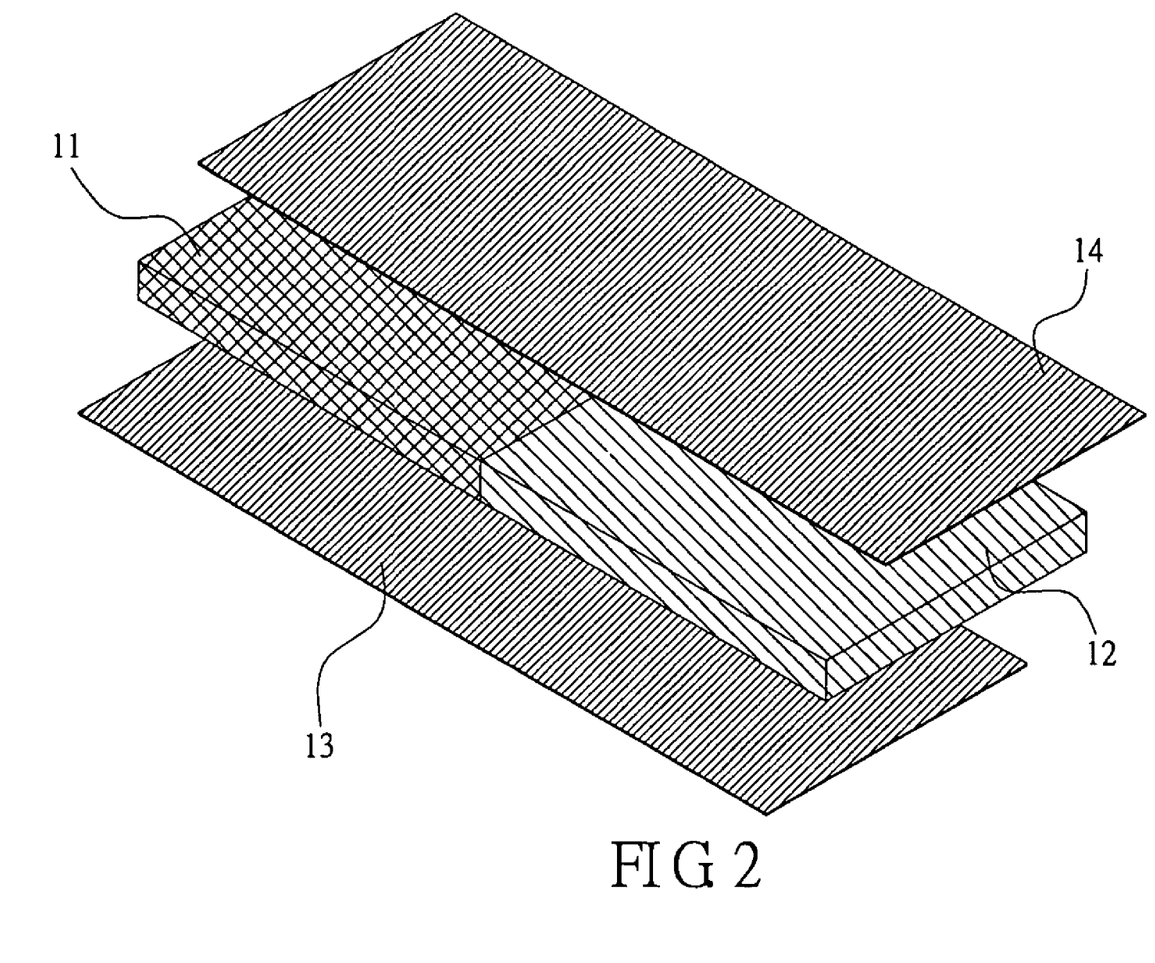
FIG. 2 is an exploded view of a triple-layered interleaving striped capacitor substrate of the invention.

A single-layered capacitor substrate of the invention is shown in FIG. 1. The invention provides two dielectric materials with different dielectric coefficients to form a dielectric layer. It has both a dielectric material 11 with a low dielectric coefficient ($\in_r \leq 4$) needed for high-speed signal transmissions and a dielectric material 12 with a high dielectric coefficient ($\in_r \geq 10$) needed for the decoupling capacitor that suppresses high-frequency noise. Each of the upper and lower surfaces of the dielectric layer is provided with copper foil 13, 14 to form an interleaving striped capacitor. The capacitor substrate 10 is a copper foil 14/dielectric material 11, 12/copper foil 13 three-layered structure, as shown in FIG. 2. The capacitor substrate 10 can be inserted into any layer of a multi-layered print circuit board. Alternatively, several layers of the capacitor substrates are stacked on a print circuit board to form a capacitor substrate with multi-layered interleaving striped capacitors.

Figure 3:
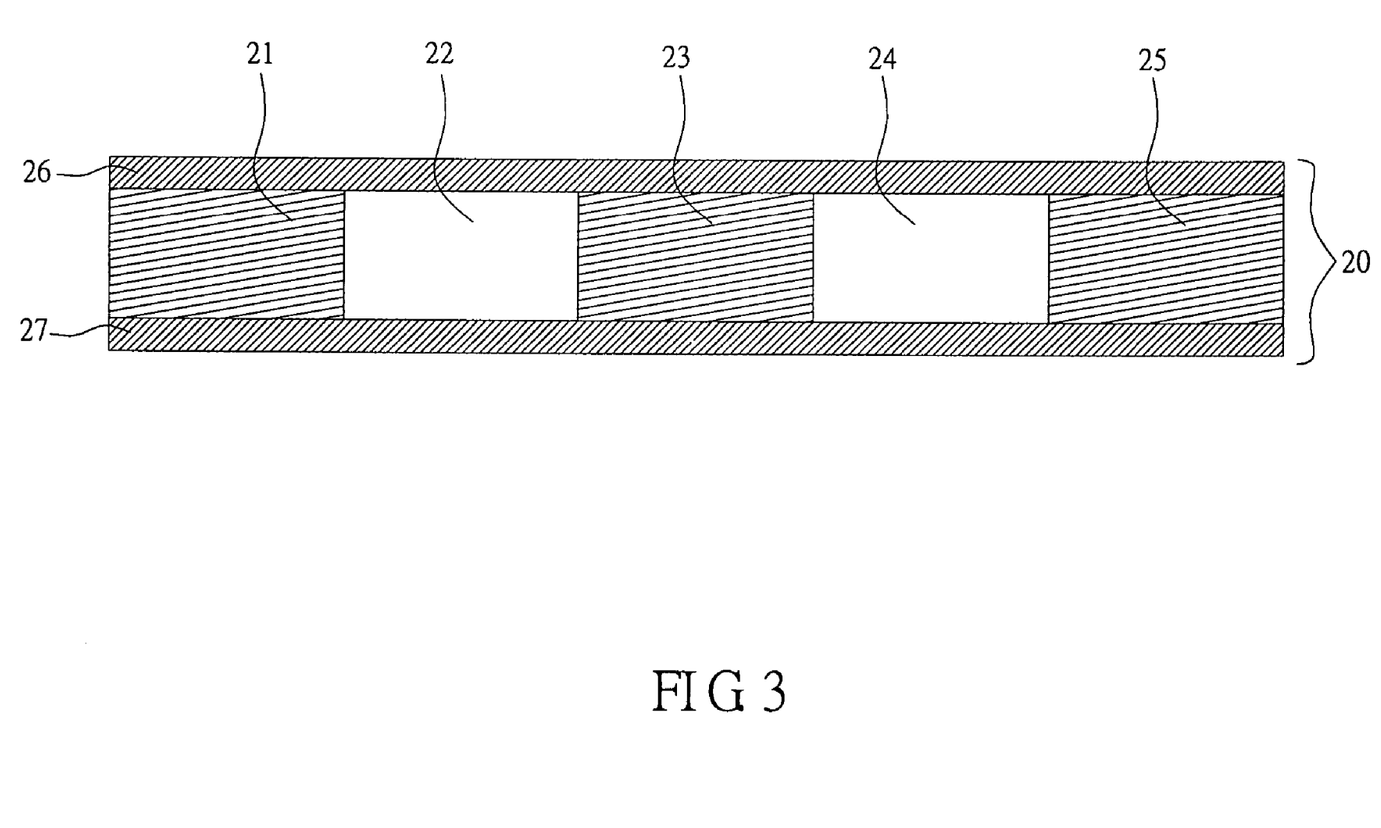
FIG. 3 is a schematic cross section of a single-layered interleaving striped capacitor substrate comprised of five dielectric materials.

Another embodiment of the invention is shown in FIG. 3, which is a single-layered interleaving striped capacitor substrate comprised of five dielectric materials. Five dielectric materials 21, 22, 23, 24, and 25 with five different dielectric coefficients are utilized to provide different electronic properties. Copper foil 26, 27 is further attached onto each of the upper and lower surfaces to form a capacitor substrate 20 with embedded interleaving striped capacitors.

Figure 4:
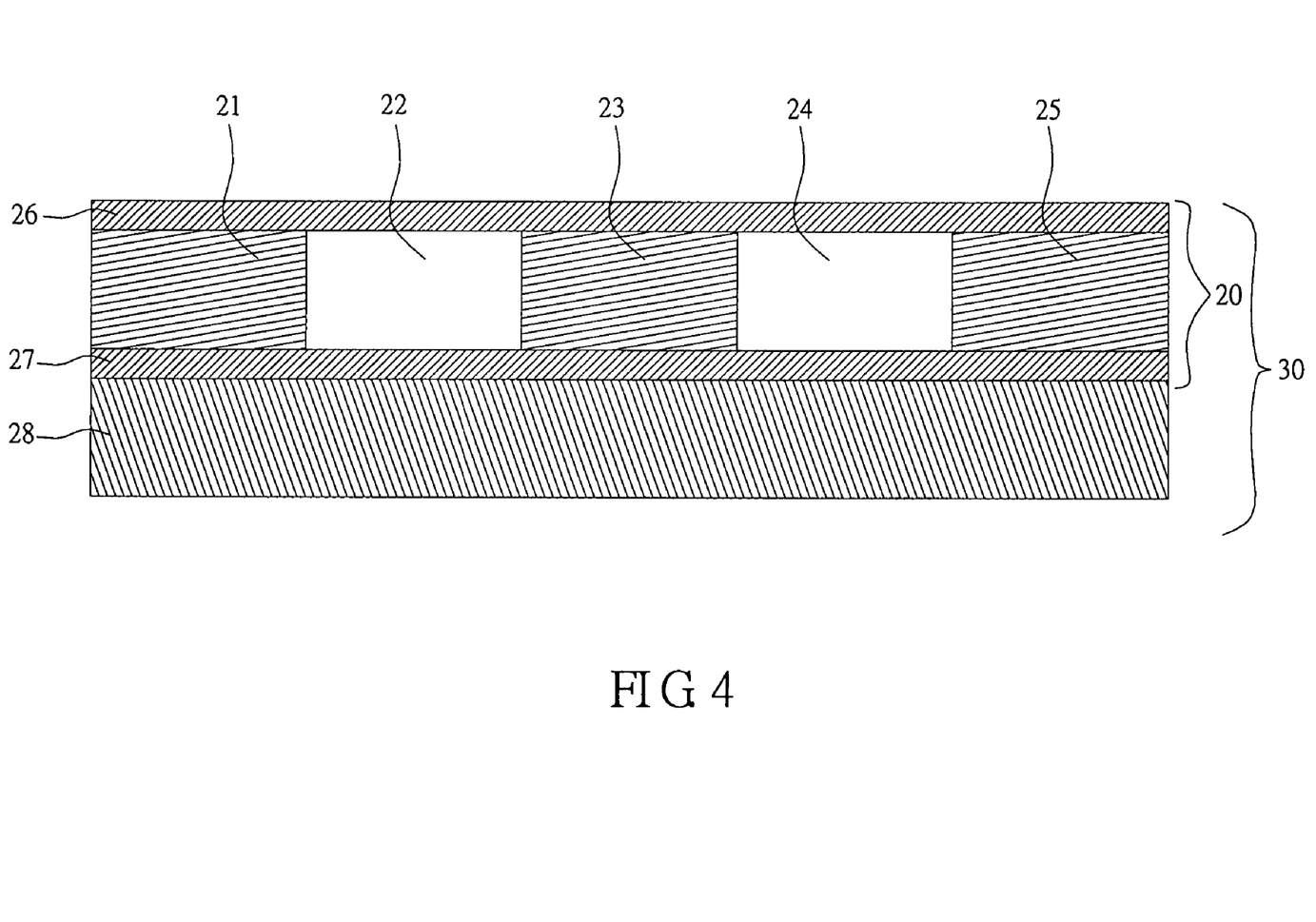
FIG. 4 is a schematic cross section of the single-layered interleaving striped capacitor substrate comprised of five dielectric materials stacked onto a print circuit board.

The single-layered striped capacitor substrate 20 with embedded interleaving striped capacitors can be stacked on a print circuit board 28, as shown in FIG. 4. Furthermore, the capacitor substrate 20 can be inserted into any layer of a multi-layered print circuit board.

The dielectric material is an organic compound such as an epoxy-ceramic hybrid. The method of forming the interleaving striped capacitors can be coating.

Therefore the formed capacitor substrate can be flexible and the structure can be easily manufactured and applied to large sized substrate.

Figure 5:
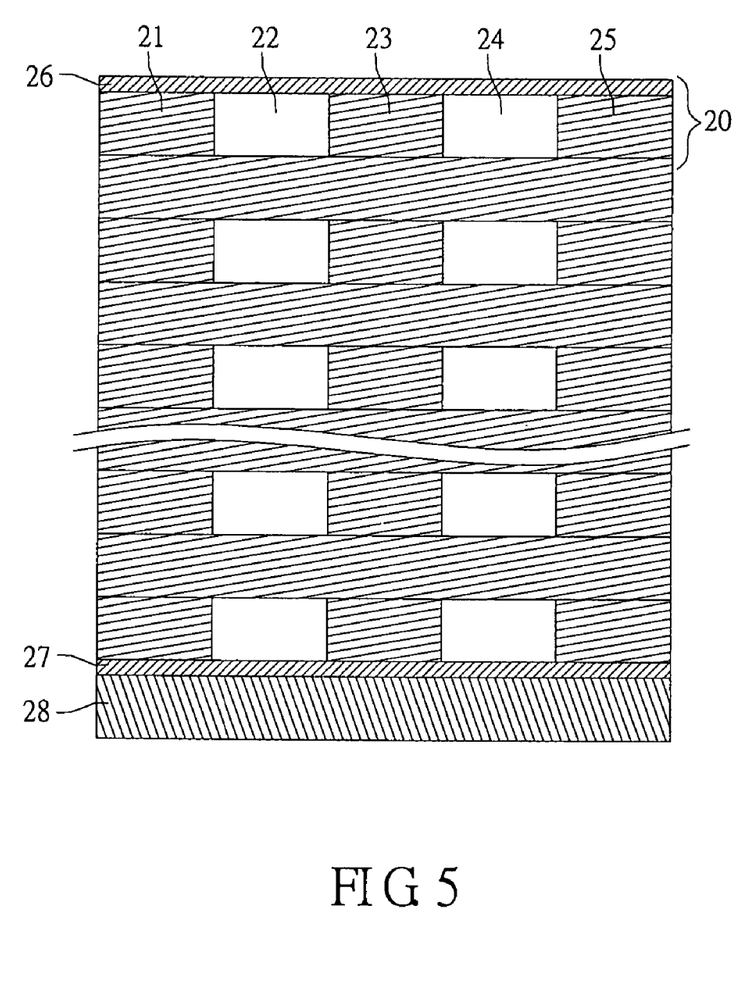
FIG. 5 is a schematic cross section of the multi-layered interleaving striped capacitor substrate comprised of five dielectric materials stacked onto a baseboard.
Figure 6:
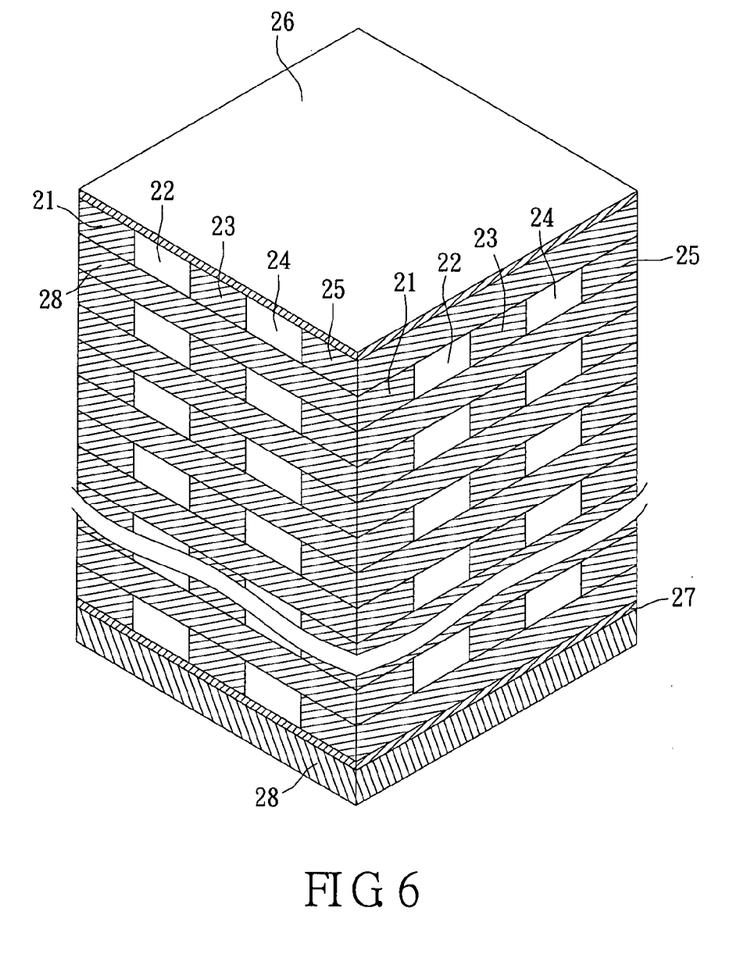
FIG. 6 is a 3D diagram of a multi-layered interleaving striped capacitor substrate comprised of five dielectric materials stacked onto a baseboard.

Another embodiment of the invention is shown in FIGS. 5 and 6, which are a schematic cross section and 3D diagram of a multi-layered interleaving striped capacitor substrate, respectively. It is comprised of two dielectric layers with interleaving striped dielectric materials that are arranged in different directions. The five striped capacitors 21, 22, 23, 24, and 25 are utilized to provide different electronic properties. For example, the striped capacitors 21, 23, and 25 can be composed of the same high K material, and the striped capacitors 22 and 24 can be composed of the same low K material. Therefore the multi-layered interleaving striped capacitor substrate can provide two electronic properties. For example, the high K striped capacitors 21, 23, and 25 are used for suppressing noise and the low K striped capacitors are used for signal transmission. According to the structure, the striped capacitors of the first layer and the second layer with the same material can be connected to each other.

Therefore a combined capacitance can be obtained. Accordingly, the number of the layers depends on the capacitance requirements.

Copper foil 26 and 27 is further attached to each of the upper and lower surfaces to form a multi-layered capacitor substrate 20 with embedded interleaving striped capacitors.

The multi-layered striped capacitor substrate 20 with embedded interleaving striped capacitors can be stacked on a print circuit board 28, as shown in FIGS. 5 and 6. Furthermore, the multi-layered striped capacitor substrate 20 can be inserted into any layer of a multi-layered print circuit board.

The dielectric material is an organic compound such as an epoxy-ceramic hybrid. The method of forming the interleaving striped capacitors can be coating.

Therefore the formed capacitor substrate can be flexible and the structure can be easily manufactured and applied to a large sized substrate.

The types, arrangement, and width ratios of the interleaving striped dielectric materials can be modified according to practical needs. The copper foils on the upper and lower surfaces of the dielectric layer should also be etched into the required circuit. The conductive layers (the copper foil part) drawn in FIGS. 1 to 6 are only schematics. In practice, the dielectric layers with different dielectric coefficients are etched to form the capacitors in the circuit. The capacitance of each of the striped capacitors is adjusted by changing the area of the conductive layer. That is, the invention can be formed with capacitors of different dielectric coefficients using interleaving striped dielectric materials on the same substrate. This achieves the goal of having capacitors with different capacitances on a single substrate.

On the other hand, the invention can be formed by stacking a multi-layered striped capacitor substrate on one baseboard or motherboard. This achieves the goal of having combined capacitors between different layers on a single baseboard or motherboard.

Figure 7:
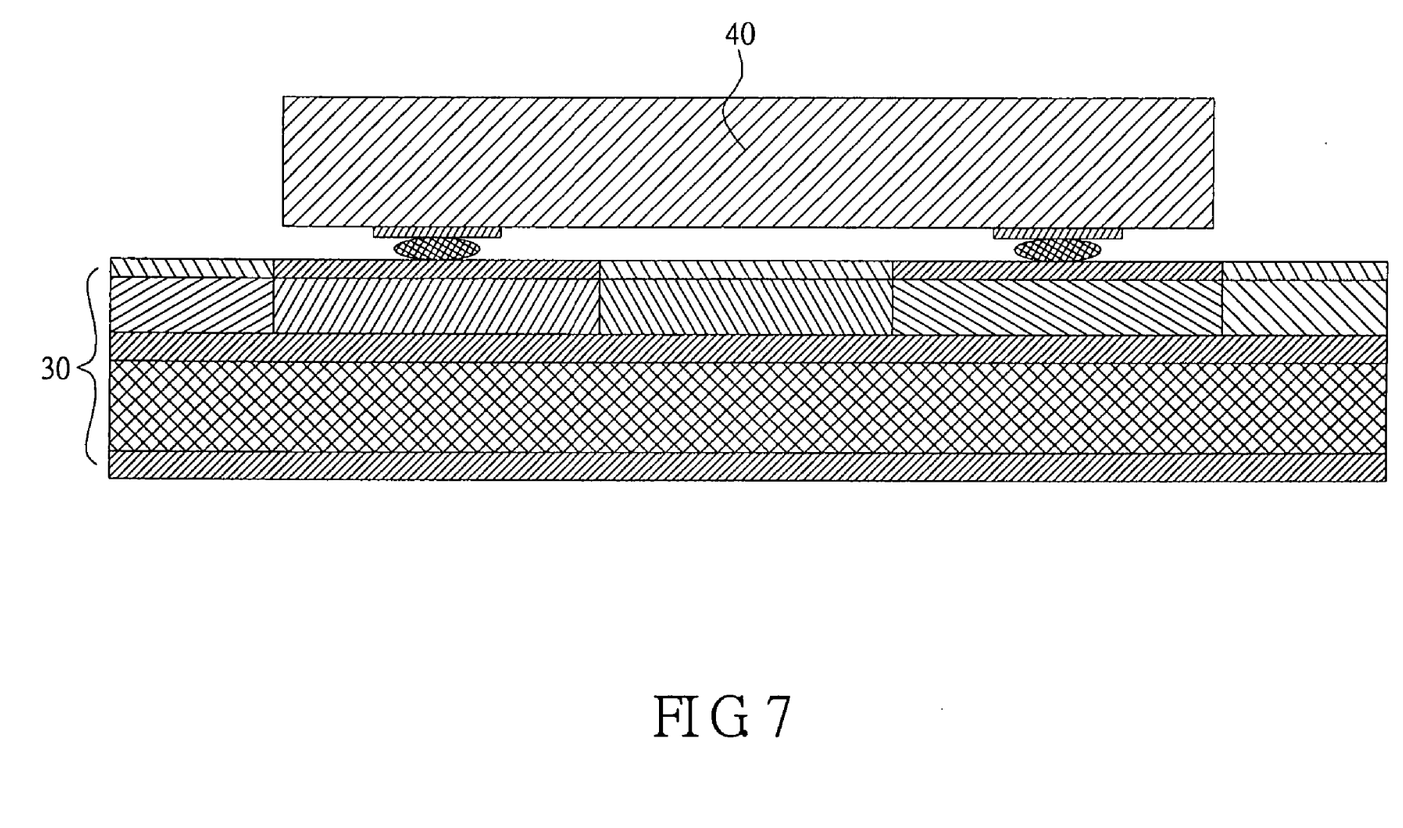
FIG. 7 is a schematic cross section of the multi-layered capacitor substrate combined with an integrated circuit element.

As shown in FIG. 7, an integrated circuit (IC) 40 is combined onto a single-layered capacitor substrate 30 by crystallization. The single-layered capacitor substrate 30 is made by stacking on a traditional print circuit board. The differences of the dielectric coefficients in the interleaving striped capacitors can provide the IC 40 with different electronic properties.

The invention is a capacitor substrate including multi-layered or single-layered dielectric layers, which are comprised of interleaving striped dielectric materials with several different dielectric coefficients. The types, depositions, and width ratios of the interleaving striped dielectric materials can be modified according to practical needs. Further, the organic dielectric material with a high dielectric coefficient ($\geqq 10$) can be used as the capacitor so that a large area of combined capacitance can be easily achieved through a simpler process. This can be used as a decoupling capacitor for filtering high-frequency noise.

On the other hand, the organic dielectric material with a low dielectric coefficient ($\leqq 4$) can be used in the design of a high-speed IC transmission line (signal connection line). A low dielectric coefficient material has a smaller capacitor load effect. Consequently, the same circuit area can have more high-speed area for wiring. The electric signals on the lines can be transmitted faster.

Furthermore, because the dielectric material is organic, it can be flexible such that the capacitor substrate can be flexible and broaden the application.

According to the above description, such elements can be applied to synchronized digital systems, such as personal computers. The design is thus made simpler, and timing margin control is easier. For example, the bus lines from the central processing unit (CPU) to the SDRAM and the system memory bus lines from the chip set to the DRAM can have a higher efficiency owing to the decrease in propagation delay time. The work frequency and performance of the system can thus be greatly enhanced.

Although the invention has been described with reference to specific embodiments, this description is not meant to be construed in a limiting sense. Various modifications of the disclosed embodiments, as well as alternative embodiments, will be apparent to persons skilled in the art. It is, therefore, intended that the appended claims will cover all modifications that fall within the true scope of the invention.

What is claimed is:

1. An interleaving striped capacitor substrate structure for pressing-type print circuit boards, the structure comprising:
   a first dielectric layer, which consists of a plurality of first interleaving striped dielectric materials;
   a second dielectric layer, which consists of a plurality of second interleaving striped dielectric materials and stacks on the first dielectric layer, wherein the direction of the second interleaving striped dielectric material is perpendicular to the first interleaving striped dielectric material;
   an upper-surface conductive metal layer, which is attached on the upper surface of the second dielectric layer; and
   a lower-surface conductive metal layer, which is attached on the bottom surface of the first dielectric layer.

2. The interleaving striped capacitor substrate structure of claim 1, wherein the first interleaving striped dielectric material and the second interleaving striped dielectric material are consisted of an organic material.

3. The interleaving striped capacitor substrate structure of claim 2, wherein the organic material is an organic ceramic hybrid.

4. The interleaving striped capacitor substrate structure of claim 1, wherein the first interleaving striped dielectric material and the second interleaving striped dielectric material are consisted of an organic material and include at least one high dielectric coefficient material with a dielectric coefficient higher than 10.

5. The interleaving striped capacitor substrate structure of claim 1, wherein the first interleaving striped dielectric material and the second interleaving striped dielectric material are consisted of an organic material and include at least one low dielectric coefficient material with a dielectric coefficient below 4.

6. The interleaving striped capacitor substrate structure of claim 1, wherein the upper-surface conductive metal layer and the lower-surface conductive metal layer are made of copper.

7. The interleaving striped capacitor substrate structure of claim 1, wherein the upper-surface conductive metal layer and the lower-surface conductive metal layer are formed with a desired conductive metal wire pattern in accordance with the plurality of interleaving striped dielectric materials.

8. The interleaving striped capacitor substrate structure of claim 1, wherein the upper-surface conductive metal layer and the lower-surface conductive metal layer form a plurality of capacitors with the plurality of interleaving striped dielectric materials.

9. The interleaving striped capacitor substrate structure of claim 1 combined with one selected from a single-layered print circuit board and a multiple-layered print circuit board.

10. An interleaving striped capacitor substrate structure for pressing-type print circuit boards, the structure comprising:
- a first dielectric layer, which consists of a plurality of first interleaving striped dielectric materials;
- a second dielectric layer, which consists of a plurality of second interleaving striped dielectric materials and stacks on the first dielectric layer, wherein the direction of the second interleaving striped dielectric material is perpendicular to the first interleaving striped dielectric material;
- a first conductive metal layer, which is attached on an outer surface of the first dielectric layer, is etched to form a circuit and forms a capacitor with the dielectric layer; and
- a print circuit board, which has a second conductive metal layer that is attached on an outer surface of the second dielectric layer.

11. The interleaving striped capacitor substrate structure of claim 10, wherein the first interleaving striped dielectric material and the second interleaving striped dielectric material are consisted of an organic material.

12. The interleaving striped capacitor substrate structure of claim 11, wherein the organic material is a organic ceramic hybrid.

13. The interleaving striped capacitor substrate structure of claim 10, wherein the plurality of first interleaving striped dielectric material and the plurality of second interleaving striped dielectric material are consisted of an organic material and include at least one high dielectric coefficient material with a dielectric coefficient higher than 10.

14. The interleaving striped capacitor substrate structure of claim 10, wherein the plurality of first interleaving striped dielectric material and the plurality of second interleaving striped dielectric material are consisted of an organic material and include at least one low dielectric coefficient material with a dielectric coefficient below 4.

15. The interleaving striped capacitor substrate structure of claim 10, wherein the first conductive metal layer and the second conductive metal layer are made of copper.

16. The interleaving striped capacitor substrate structure of claim 10, wherein the first conductive metal layer and the second conductive metal layer are formed with a desired conductive metal wire pattern in accordance with the plurality of first and second interleaving striped dielectric materials.

17. The interleaving striped capacitor substrate structure of claim 10, wherein the first conductive metal layer and the second conductive metal layer form a plurality of capacitors with the plurality of first and second interleaving striped dielectric materials.

18. The interleaving striped capacitor substrate structure of claim 10 combined with one selected from a single-layered print circuit board and a multiple-layered print circuit board.

* * * * *